United States Patent [19]

Wintzer

[11] 4,145,574

[45] Mar. 20, 1979

[54] CIRCUIT ARRANGEMENT FOR THE TRANSMISSION OF DIGITAL SIGNALS BETWEEN SUBSCRIBER STATIONS OF A TIME MULTIPLEX TELECOMMUNICATIONS NETWORK

[75] Inventor: Klaus Wintzer, Munich, Fed. Rep. of Germany

[73] Assignee: Siemens Aktiengesellschaft, Berlin & Munich, Fed. Rep. of Germany

[21] Appl. No.: 837,297

[22] Filed: Sep. 27, 1977

[30] Foreign Application Priority Data

Sep. 28, 1976 [DE] Fed. Rep. of Germany ....... 2643687

[51] Int. Cl.² ......................... H04J 3/00; H04Q 11/04
[52] U.S. Cl. .............................. 179/15 A; 179/15 AL
[58] Field of Search .......... 179/15 A, 15 AL, 15 AT, 179/15 BS; 340/347 C

[56] References Cited

U.S. PATENT DOCUMENTS

| 3,774,339 | 8/1976 | Lutz | 179/15 BS |
| 3,970,796 | 7/1976 | Gyurki | 179/15 BS |
| 3,984,829 | 10/1976 | Zwack | 340/347 C |

Primary Examiner—William C. Cooper
Assistant Examiner—Joseph A. Popek
Attorney, Agent, or Firm—Hill, Gross, Simpson, Van Santen, Steadman, Chiara & Simpson

[57] ABSTRACT

In a PCM time multiplex telecommunications network the digital signal input of the coder/decoder of each subscriber station has an individually controllable receiving memory connected to the input of the coder/decoder, and the digital signal output of the respective coder/decoder has an individually controllable transmitting memory connected thereto. The control of the signal receipt and transmission by the coder/decoder takes place at different points in time than the receipt of PCM signals by the receiving memory, and the transmission of PCM signals by the transmitting memory.

5 Claims, 2 Drawing Figures

CIRCUIT ARRANGEMENT FOR THE TRANSMISSION OF DIGITAL SIGNALS BETWEEN SUBSCRIBER STATIONS OF A TIME MULTIPLEX TELECOMMUNICATIONS NETWORK

BACKGROUND OF THE INVENTION

1. Field of the Invention

The invention relates to a circuit arrangement for the transmission of digital signals between subscriber stations of a time multiplex telecommunications network, in particular a PCM time multiplex telecommunications network, via a two-wire multiplex line operated in a four-wire manner, on which a transmission pulse is assigned to the respective subscriber station for signal transmission, and a receiving pulse which is separate therefrom in time is assign for the signal receipt.

2. Description of the Prior Art

A circuit for pulse electrical energy transmission between subscriber stations in time multiplex telephone switching systems is already known in the art, for example from German Pat. No. 1,276,747, in particular in connection with FIG. 8 thereof. In this German patent, a transmitting line terminated with a storage capacitor and a receiving line terminated with a separate storage capacitor are associated with each subscriber station. The transmitting lines and the receiving lines of all subscriber stations belonging to the time multiplex switching system are, in each case, connected via a separate switch to a two-wire multiplex line operated in a four-wire manner. Further, there is a reactance store embodied as an inductance on this two-wire multiplex line. For pulse energy transmission from one subscriber station to another subscriber station, the switch located in the transmitting line of the first-mentioned subscriber station and the switch located in the receiving line of the second-mentioned subscriber station are respectively momentarily closed in immediate successive time intervals. For a pulse energy transmission in the other transmission direction, the switch located in the transmitting line of the second-named subscriber station and the switch located in the receiving line of the first-mentioned subscriber station are momentarily closed during two intermediately successive time intervals. In this manner, in the known circuit arrangement, analog signal samples are transmitted pulse-wise via the two-wire multiplex line which is operated in a four-wire manner, between the transmitting and receiving line terminating storage capacitors and, thus, between the subscriber stations which are participating in a connection. In addition to the circumstance that, in each case, only analog signal samples can be transmitted between the subscriber stations participating in a connection, it is a disadvantageous fact, in the known circuit arrangement, that two intermediately successive control pulses for the actuation of the corresponding switches are necessary for the respective signal transmission direction. Based on the fact that four control pulses occurring at various points in time are thus used per connection, and based on the fact that the number of control pulses available for a switching activation in the known circuit arrangement mentioned above is determined by the maximum number of transmission time channels available on the two-wire multiplex line, it is only possible in the known circuit arrangement for a relatively small number of connections to be established, as it were simultaneously, via the two-wire multiplex line, in each case.

Further, a circuit arrangement for the transmission of digital information in a time multiplex telecommunications network is known in the art, for example from the German allowed published application No. 2,346,984. In this known circuit arrangement, the subscriber stations which are capable of receiving and transmitting the digital information are connected, via a two-wire line, to a hybrid which is connected, by way of a receiving memory, to a receiving line which feeds in signals, and, by way of the transmitting memory, to a transmitting line which conveys signals away. The transmitting memory and the receiving memory each have a number of memory stages corresponding to the number of bits belonging to a digital information. The relevant memories serve here only for buffering, since the digital signals on the two transmission lines are transmitted with a higher transmission frequency than on the above-mentioned two-wire line. In view of the fact that the two transmitting lines can transmit digital information respectively only in one transmission direction, the circuit technological expense which arises is relatively high.

SUMMARY OF THE INVENTION

The object of the present invention is to provide, in a circuit arrangement of the type mentioned above, digital signal transmission between subscriber stations with relatively small circuit technical expense and with a simpler time control of the transmission operations on the two-wire multiplex line.

This object is achieved, in a circuit arrangement of the type mentioned, in that each subscriber station is connected, via a coder/decoder arrangement operating in accordance with an iterative method, to the input of a transmitting memory and to the output of a receiving memory, that the respective transmitting memory is connected, with its output, to the two-wire multiplex line, and the respective receiving memory is connected, with its input, to the two-wire multiplex line, and that the respective transmitting memory is effectively controllable, for transmitting digital signals, by pulses of the transmission pulse assigned to its associated subscriber station and the respective receiving memory is effectively controlled by pulses of the receiving pulse assigned to its subscriber station for receiving digital signals. The coder/decoder arrangement associated with the respective subscriber station is effectively controlled by pulses of a separate control pulse assigned to the appertaining subscriber station, for the reception of digital signals from the associated receiving memory and for the transmission of digital signals to the associated transmitting memory, with each of these pulses having a number of bit pulses corresponding to the number of bits forming a digital signal, and with the bit pulses of the control pulse occurring at points in time which are in the same pulse time raster as the bit pulses of the transmitting pulse allocated to the relevant subscriber station and of the receiving pulse assigned to the relevant subscriber station.

The present invention affords the advantage that, in a relatively simple manner, namely essentially by use of one transmitting memory and one receiving memory per subscriber station, and by the above-indicated assignment of the pulses, it is possible to transmit digital signals between subscriber stations of a time multiplex telecommunications network, in particular a PCM time multiplex telecommunications network, via a two-wire multiplex line operated in a four-wire manner. In the process, on the two-wire multiplex line, only two separate time channels are used per connection, which are determined by the transmission pulse assigned to the one subscriber station and by the reception pulse assigned to the relevant subscriber station. By means of the transmission pulse assigned to the one subscriber station, by the way, the receiving pulse for the other subscriber station involved in the respective connection is determined. In a corresponding manner, by means of the receiving pulse assigned to the one subscriber station, the transmitting pulse for the other subscriber station involved in the respective connection is determined.

According to a practical and advantageous development of the invention, all transmission memories are, in each case, successively cyclically triggerable by a commonly provided control circuit, and all receiving memories are likewise triggerable by a jointly provided control circuit. As a result of this, the advantage of a particularly simple and reliable triggering of the transmitting memories and of the receiving memories is produced.

According to a further advantageous development of the invention, the control circuit for all transmitting memories has a cyclically functioning storage set, in which addresses designating the individual transmitting memories are contained; and for all receiving memories, the control circuit has a separate, cyclically functioning storage set, in which addresses designating the individual receiving memories are contained. As a result of this arrangement, a particularly small circuit expense is provided for the control circuits.

According to yet a further advantageous development of the invention, the two-wire multiplex line is connected to an input and to a output of a coupling device which contains at least one time-coupling stage, which device is connected, with at least one further input and at least one further output to at least one further multiplex line. By means of this arrangement, the advantage is provided that, in a relatively simple manner, one is able to establish connections between subscriber stations which are connected to the indicated two-wire multiplex line, and subscriber stations connected to the respectively provided further multiplex line. Through the technique of time channel conversion in the coupling device it is assured in a advantageous manner that, in the course of establishing a connection between two subscriber stations which are connected to two different multiplex lines and which, in turn, are connected to the coupling device, problems do not exist with respect to the assignment of transmitting pulses, receiving pulses and control pulses.

According to a still further advantageous development of the invention, a separate storage set is provided for the control of coupling elements belonging to the coupling device. By means of this, a particularly small control circuit expense arises for the coupling device.

According to yet a further advantageous feature of the invention, the transmitting memory associated with the respective subscriber station and the receiving memory associated with the relevant subscriber station are contained in the coder/decoder arrangement associated with the relevant subscriber station. This measure affords the advantage of an especially small circuit expense, insofar as buffer memories which are normally present in the coder/decoder arrangement can also be utilized as transmitting memories or, respectively, receiving memories.

BRIEF DESCRIPTION OF THE DRAWING

Other objects, features and advantages of the invention, its organization, construction and operation will be best understood from the following detailed description taken in conjunction with the accompanying drawing, on which.

DESCRIPTION OF THE PREFERRED EMBODIMENTS

Figure 1:
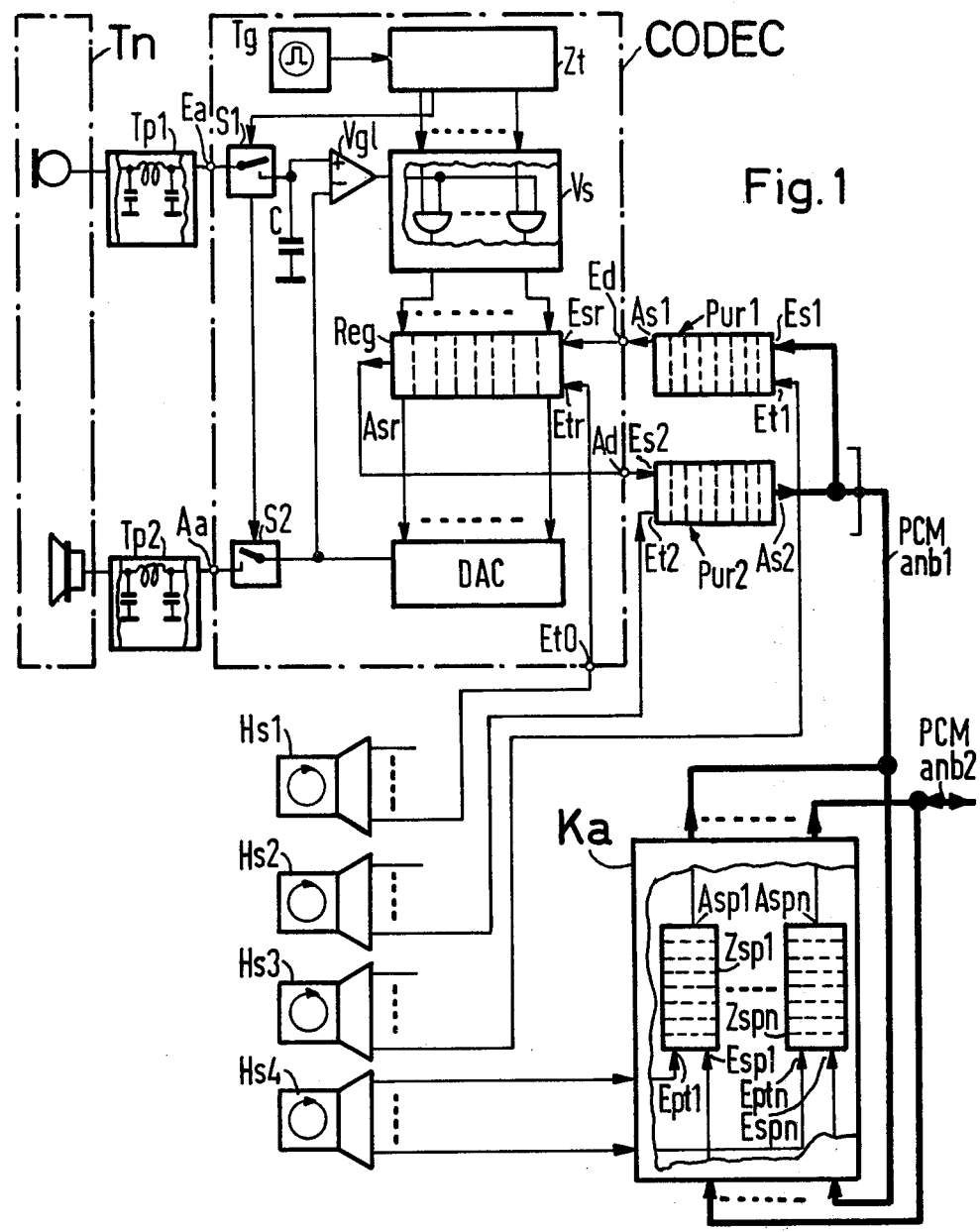
FIG. 1 is a schematic representation of a circuit arrangement constructed in accordance with the principles of the present invention.

Referring to FIG. 1, a coder/decoder arrangement CODEC is illustrated as being associated with a subscriber station Tn which comprises a signal transmitter which emits analog signals, and a signal receiver for picking up analog signals. The signal transmitter of the subscriber staton Tn is connected, by way of a low pass filter Tp1, to an analog signal input Ea of the coder/decoder CODEC. The signal receiver of the subscriber station Tn is connected, via a low pass filter Tp2, to an analog signal output Aa of the coder/decoder CODEC. By way of a switch S1, the non-inverting input (+) of a comparator Vg1 is connected to the analog input Ea of the coder/decoder CODEC. Further, a storage capacitor C is connected to the non-inverting input (+) of the comparator Vg1. The output of the comparator Vg1 is connected to an input of a logic control circuit Vs, specifically, in particular, to one input of a plurality of AND gates which may form the logic control circuit Vs. The other inputs of the AND gates are connected to outputs of a counter Zt which is controlled by a pulse generator Tg. The outputs of the AND gates are connected to inputs of register stages of a register Reg which may be constructed as a shift register. The register Reg is connected, with a signal input Esr serving for a serial signal feed, to a digital signal input Ed of the coder/decoder CODEC. With a signal output Asr serving for the serial signal emission, the register Reg is connected to a digital signal output Ad of the coder/decoder CODEC. A digital/analog converter DAC has a plurality of inputs connected to the outputs of the individual register stages of the register Reg. The digital/analog converter DAC can be of the type which is known per se as a R - 2R resistance network which is fed, for example, by constant current sources. The output of the digital/analog converter DAC is connected, on the one hand, to the inverting input (−) of the comparator VG1 and, on the other hand, to the analog signal output Aa of the coder/decoder CODEC by way of a switch S2. The control or actuation inputs of the two switches S1 and S2 are connected to a separate output of the counter Zt.

The register Reg is connected, by way of a separate pulse input Etr, to a pulse input Et0 of the coder/decoder CODEC. Separate timing pulses are fed to the input Et0 from a control circuit Hs1. The control circuit Hs1 is one of a plurality of control circuits Hs1–Hs4, and represents a storage set which can, for example, consist of a circulating memory, such as a magnetostrictive delay line, with a decoder connected to the output thereof. In the relevant storage sets, addresses are contained which designate the individual memories or, respectively, registers or subscriber stations provided.

A buffer register Pur1 representing a receiving memory is connected, by way of its signal output As1, to the digital signal input Ed of the coder/decoder CODEC. This buffer register Pur1 is connected, with its signal input Es1, to a two-wire multiplex line PCManb1 which is operated in a four-wire manner, by a way of which the digital signals are transmitted to and from the subscriber station Tn represented in the drawing.

These digital signals involved here may, in the present case, be PCM words, for example, each comprising eight bits.

Further, a buffer register Pur2 represents a transmitting memory and is connected, by way of its signal output As2, to the two-wire multiplex line PCManb1. The buffer register Pur2 is also connected, by way of its signal input Es2, to the digital signal output Ad of the coder/decoder CODEC.

At a separate pulse input Et2, the buffer register Pur2 is triggerable with timing pulses from the above-mentioned control circuit Hs2. In a corresponding manner, the other buffer register Pur1 is triggerable, at a separate pulse input Et1, with timing pulses supplied by the control circuit Hs3.

With regard to the buffer registers Pur1 and Pur2, it will be appreciated that this type of buffer register and, respectively, the transmitting memories and receiving memories, are to be individually associated with each subscriber station of the time multiplex telecommunications network containing the subscriber station indicated in FIG. 1. The buffer registers thus provided in a plurality can then be connected, with corresponding inputs or, respectively, outputs, jointly to the two-wire multiplex line PCManb1, such as is indicated by a multiple symbol on the relevant two-wire multiplex line PCManb1.

A coupling device Ka is also connected to the two-wire multiplex line PCManb1, which in the present case contains only a so-called time coupling stage. Intermediate memories Zsp1-Zspn, which can be formed by registers, belong to the time coupling stage. The registers Zsp1-Zspn are, in the present case, connected by way of their signal inputs Esp1-Espn, to separate inputs of the coupling device Ka. The signal outputs Asp1-Aspn of the registers Zsp1-Zspn are connected to separate outputs of the coupling device Ka. In the present case, an input and an output of the coupling device Ka are commonly connected to the two-wire multiplex line PCManb1. A further input and a further output of the coupling device Ka are commonly connected to a further two-wire multiplex line PCManb2, to which subscriber stations can be connected in a corresponding manner, as shown in FIG. 1. Such multiplex lines can, if necessary, be provided in greater numbers and can be connected to the coupling device Ka. With regard to the registers Zsp1-Zspn, it should be additionally noted that the same are triggerable with timing pulses, at separate inputs Ept1-Eptn, by the control circuits mentioned above or, respectively, from the storage set Hs4 forming the same.

With regard to the registers represented in FIG. 1, it should also be noted that they each have a storage capacity such that they are capable of storing a digital signal of the digital signals to be transmitted by way of the two-wire multiplex line PCManb1.

Let it further be noted with regard to FIG. 1 that the registers Zsp1-Zspn of the coupling device Ka can be connected, with their signal inputs Esp1-Espn or, respectively, with their signal outputs Asp1-Aspn, in each case directly to the inputs or, respectively, the outputs of the coupling device Ka. The low pass filters Tp1 and Tp2 represented in FIG. 1 can each contain only one of the LC members schematically illustrated. With regard to the logic control circuit Vs illustrated in FIG. 1 as a part of the coder/decoder CODEC, it should also be noted that the AND gates of the logic circuit VS can be connected, with their one inputs, directly to the output of the comparator Vg1 and, with their other inputs, directly to corresponding outputs of the counter Zt. The outputs of the gates can be connected directly to the corresponding inputs of the register stages of the register Reg.

Figure 2:
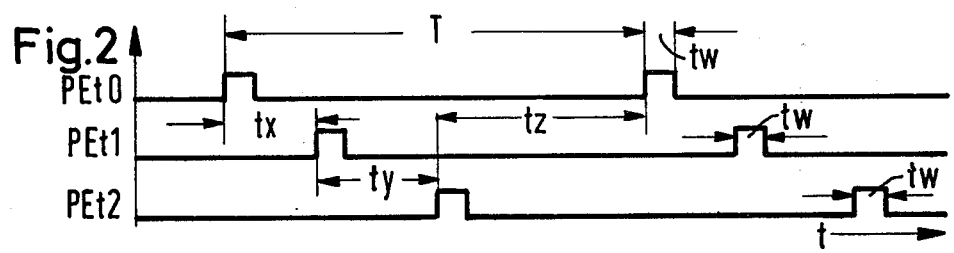
FIG. 2 is a time diagram illustrating the temporal positions of control pulses which can be assigned to the circuit arrangement illustrated in FIG. 1.

In the following, the method of operation of the circuit arrangement represented in FIG. 1 is explained with reference to the time diagram illustrated in FIG. 2. In the time diagram of FIG. 2, in the upper line designated PEt0, pulses are illustrated which occur at the pulse input Et0 of the coder/decoder of FIG. 1. For a sake of simplicity only, the pertinent pulses are represented in FIG. 2 as pulses occurring during a time interval tw. Actually, during the interval tw of each of the pulses of the control pulse PEt0, bit pulses may occur in such a number that the entire content of the associated receiving memory Pur1 is fed into the register Reg, and that at the same time the entire content of the register Reg of the coder/decoder CODEC is fed out of the register. The pulses, are respectively, bit pulses of the control pulse PEt0 occurring in each case during a time interval tw occur cyclically in succession with a time spacing T, which is equal to the duration of a pulse frame in the time multiplex telecommunications network. This time span T can, for example, amount to 125 μs, which is the usual pulse frame duration in a 32/30 channel time multiplex system.

In the central line of the time diagram of FIG. 2, designated PEt1, pulses of a control pulse PEt1 are represented, which pulses occur at the pulse input Et1 of the buffer register Pur1 which represents a receiving memory in FIG. 1. These pulses, as well, occur during a time interval tw, and specifically within the time interval T. It should be noted that the pulses of the receiving pulse PEt1, as well, may be respectively formed by bit pulses in such a number that the occurrence of such a number of bit pulses leads to a digital signal being stored in the receiving memory Pur1.

In the lower line of the time diagram of FIG. 2, pulses associated with the control pulse PEt2 are illustrated, which pulses occur at the pulse input Et2 of the buffer register Pur2 which represents a transmitting memory. These pulses, also, have a duration tw in each case; and these pulses also occur cyclically in succession and within a time span T. These pulses may also each be formed by bit pulses in such a number that, with the occurrence of such a number of bit pulses, a digital signal is completely read out of the transmitting memory Pur2.

As indicated in FIG. 2, the pulses of the control pulse Et0 occur at points in time which, for the most part, are different from the points in time of the occurrence of the pulses of the receiving pulse PEt1 assigned to the same subscriber station, and the transmitting pulse PEt2 assigned to the relevant subscriber station Tn. According to FIG. 2, the pulses of the receving pulse PEt1 assigned to the subscriber station Pn occur, in each case, after a time interval tx upon the occurrence of the control pulse PEt0. The pulses of the transmitting pulse PEt2 assigned to the subscriber station occur, in each case, after a time interval ty upon the occurrence of the pulses of the receiving pulse PEt1 assigned to the relevant subscriber station. Between the occurrence of the pulses of the transmitting pulse PEt2 assigned to the subscriber station and the pulses of the control pulse PEt0 also assigned to the relevant subscriber station there is therefore a remaining time interval tz. The sum of the time intervals tx and ty and tz produces the duration T of a pulse frame. Whereas, with regard to the pulses of the receiving pulse PEt1 assigned to the subscriber station, and of the transmitting pulse PEt2 assigned to the subscriber station, the requirement exists that these pulses must occur at different points in time — the two-wire multiplex line according to FIG. 1 is in particular a two-wire multiplex line operated in a four-wire manner — there exists for the pulses of the control pulse PEt0 with regard to the pulses of the receiving pulse and of the transmitting pulse, a requirement that, in case of a coincidence of the control pulse PEt0 with the transmitting pulse or the receiving pulse, the bit pulses of the control pulse PEt0 occur at points in time which lie in the same bit pulse time raster as the bit pulses of the transmission pulse PEt2 assigned to the relevant subscriber station, or, respectively, of the receiving pulse PEt1 assigned to the subscriber station. In this manner, it is assured that no digital signals which are contained in the register Reg or, respectively, in the transmitting memory Pur2 are falsified by shift operations. Moreover, by the allocation of pulses sufficient for the indicated time conditions to the respective subscriber station of the time multiplex telecommunications network, it is assured that a largely unhampered reception or transmission of digital signals by or from the coder/decoder CODEC associated with the subscriber station is achieved with reference to the transmitting pulse allocated to the subscriber station, and also with reference to the receiving pulse allocated to the subscriber station.

With regard to the circuit arrangement represented in FIG. 1, it should be additionally pointed out that the circuit arrangement can be simplified by permanently assigning one and the same control pulse to all coder/decoders.

By way of the coupling device Ka provided between the two-wire multiplex line PCMamb1 and the two-wire multiplex line PCManb2, the subscriber stations connected to the two-wire multiplex line PCManb1 by way of one transmitting memory and one receiving memory each, as well as a coder/decoder arrangement, are connectible to corresponding two-wire multiplex lines, to which corresponding subscriber stations can be connected.

With regard to the coder/decoder CODEC represented in FIG. 1, it should be noted that this coder/decoder CODEC may be organized in such a manner that, upon storing of a digital signal in the register Reg, a digital/analog conversion is undertaken. The analog signal following this conversion is fed, via the switch S2, to the receiving branch of the associated subscriber station Tn. In addition, at the relevant point in time, a scanning signal sample of the analog signal emitted by the transmitting branch of the subscriber station Tn is stored at the capacitor C of the coder/decoder CODEC. Thereupon, an analog/digital conversion operation occurs in the coder/decoder and, after conclusion of this conversion, the coder/decoder CODEC is permitted to assume an idle condition in which, in the register Reg, a digital signal is contained which corresponds to the previously received and converted analog signal. With the occurrence of a further pulse of the control pulse PEt0 assigned to the subscriber station Tn or, respectively, to the coder/decoder CODEC associated therewith, this digital signal is stored in the associated transmitting memory Pur2, while at the same time a digital signal to be converted into an analog signal is received from the associated receiving memory Pur1. A more detailed discussion of the structure and of the mode of operation of the coder/decoder CODEC of FIG. 1 is already available in the literature, for example in the German application No. P 25 38 543.7, and the foregoing discussion is believed to be adequate for the purpose of the present application.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for the transmission of signals between a subscriber station having an input for receiving analog signals and an output for emitting analog signals and a two-wire multiplex line operated as a four-wire multiplex line in a time division multiplex telecommunications system having a plurality of such subscriber stations and other multiplex lines, comprising:

a coder/decoder arrangement for each subscriber station including a first input connected to the output of the subscriber station to receive analog signals therefrom, a first output connected to the input of the subscriber station to feed analog signals thereto, a second input for receiving digital signals, a second output for emitting digital signals, conversion means connected to said first and second inputs and to said first and second outputs for converting received analog and digital signals to the opposite type of signals, and a control input for receiving first control pulses to effect an input of digital signals at said second input and an output of digital signals at said output;

a receiving memory for each subscriber station including an input connected to the multiplex line, an output connected to said second input of said coder/decoder arrangement and a control input for receiving second control pulses to effect an input of digital information from the time multiplex line, each of said receiving memories comprising a cyclically triggerable shift register;

a cyclically triggerable shift register transmitting memory for each subscriber station including an input connected to said second output of said coder/decoder arrangement, an output connected to the multiplex line, a control input for receiving third control pulses to effect transmission of digital information on the multiplex line; and control circuit means connected to said coder/decoder arrangement control input, to said receiving memory control input and to said transmitting memory control input for providing the first, second and third control pulses thereto, each of said control pulses having a predetermined number of bit pulses corresponding in number to the number of bit pulses forming a digital word in the transmission system, the control pulses time-spaced such that the bit pulses of the first control pulse occur at times which lie in the same pulse time raster defined by the bit pulses of the second and third control pulses assigned to the receiving and transmitting memories, said control means including means for generating respective third control pulses for said transmitting memories including a circulating memory connected to said transmitting memories and storing the addresses thereof, said control circuit comprising means for generating respective second control pulses for said receiving memories including a circulating memory connected to and storing the addresses of said receiving memories.

2. The circuit arrangement of claim 1, wherein: each of said circulating memories comprises a magnetostrictive delay line.

3. The circuit arrangement of claim 1, comprising: a coupling device having a plurality of inputs and outputs, one of said inputs and one of said outputs connected to the two-wire multiplex line and another of said inputs and another of said outputs connected to a further multiplex line, said coupling device including at least one time coupling stage for transferring digital signals between the multiplex lines.

4. The circuit arrangement of claim 3, wherein: said control circuit means comprises a separate storage set connected to and providing control signals to said time coupling stage to cause the transfer of data signals therethrough.

5. The circuit arrangement of claim 1, wherein: said coder/decoder arrangement for a subscriber station contains the associated transmitting and receiving memories therein as a unit.

* * * * *